United States Patent
Ulrich et al.

(10) Patent No.: US 11,275,560 B2
(45) Date of Patent: Mar. 15, 2022

(54) HARDWARE FOR FLOATING-POINT ARITHMETIC IN MULTIPLE FORMATS

(71) Applicant: Meta Platforms, Inc., Menlo Park, CA (US)

(72) Inventors: Thomas Mark Ulrich, Mountain View, CA (US); Abdulkadir Utku Diril, Menlo Park, CA (US); Krishnakumar Narayanan Nair, Newark, CA (US); Zhao Wang, Newark, CA (US); Rakesh Komuravelli, Fremont, CA (US)

(73) Assignee: Meta Platforms, Inc., Menlo Park, CA (US)

( * ) Notice: Subject to any disclaimer, the term of this patent is extended or adjusted under 35 U.S.C. 154(b) by 19 days.

(21) Appl. No.: 16/795,097

(22) Filed: Feb. 19, 2020

(65) Prior Publication Data

US 2021/0255830 A1    Aug. 19, 2021

(51) Int. Cl.
*G06F 7/487* (2006.01)
*G06F 7/485* (2006.01)
*H03M 7/24* (2006.01)

(52) U.S. Cl.
CPC ............ *G06F 7/4876* (2013.01); *G06F 7/485* (2013.01); *H03M 7/24* (2013.01)

(58) Field of Classification Search
CPC   H03M 7/24; H03M 7/30; G06F 7/483; G06F 7/485; G06F 7/4876; G06F 7/57; G06F 7/575; G06N 3/04; G06N 3/06; G06N 3/063
See application file for complete search history.

(56) References Cited

U.S. PATENT DOCUMENTS

| | | | | |
|---|---|---|---|---|
| 5,268,855 | A | * | 12/1993 | Mason ............... G06F 7/483 708/204 |
| 5,481,686 | A | * | 1/1996 | Dockser ............. G06F 7/483 712/222 |
| 10,684,854 | B2 | * | 6/2020 | Valentine ........... G06F 9/3013 |
| 2019/0042544 | A1 | | 2/2019 | Kashyap |
| 2019/0079728 | A1 | * | 3/2019 | Langhammer ... H03K 19/17724 |

(Continued)

OTHER PUBLICATIONS

Extended European Search Report for European Application No. 21152465.7, dated Jun. 28, 2021, 09 Pages.

(Continued)

*Primary Examiner* — Emily E Larocque
(74) *Attorney, Agent, or Firm* — Van Pelt, Yi & James LLP

(57) ABSTRACT

A floating-point number in a first format representation is received. Based on an identification of a floating-point format type of the floating-point number, different components of the first format representation are identified. The different components of the first format representation are placed in corresponding components of a second format representation of the floating-point number, wherein a total number of bits of the second format representation is larger than a total number of bits of the first format representation. At least one of the components of the second format representation is padded with one or more zero bits. The floating-point number in the second format representation is stored in a register. A multiplication using the second format representation of the floating-point number is performed.

20 Claims, 6 Drawing Sheets

(56) References Cited

U.S. PATENT DOCUMENTS

2019/0155574 A1    5/2019  Langhammer
2019/0347553 A1*  11/2019  Lo ......................... G06N 3/082
2020/0026494 A1*  1/2020  Langhammer ...... G06F 9/30014

OTHER PUBLICATIONS

"Document No. 338302-001 US BFLOAT16—Hardware Numerics Definition", Nov. 1, 2018, retrieved from URL: <https://software.intel.com/sites/default/files/managed/40/8b/bf16-hardware-numerics-definition-white-paper.pdf?source=techstories.org?.

* cited by examiner

US 11,275,560 B2

HARDWARE FOR FLOATING-POINT ARITHMETIC IN MULTIPLE FORMATS

BACKGROUND OF THE INVENTION

A whole class of complex artificial intelligence problems can be solved using neural networks. One common operation required by many neural networks is a multiplication operation, for example, when performing matrix operations. Since artificial intelligence problems are often computationally and data intensive, hardware solutions are often beneficial for improving performance. However, the hardware to implement a floating-point multiplication operation is expensive. Moreover, different neural networks can require different number formats, which in turn can each have different hardware requirements. It is a technical challenge to create a hardware platform compatible with multiple number formats and capable of efficiently performing matrix multiplication operations. Therefore, there exists a need for a high throughput matrix multiplication scheme that is compatible with multiple number formats without introducing significant hardware complexity and expense.

BRIEF DESCRIPTION OF THE DRAWINGS

Various embodiments of the invention are disclosed in the following detailed description and the accompanying drawings.

DETAILED DESCRIPTION

Figure 1:
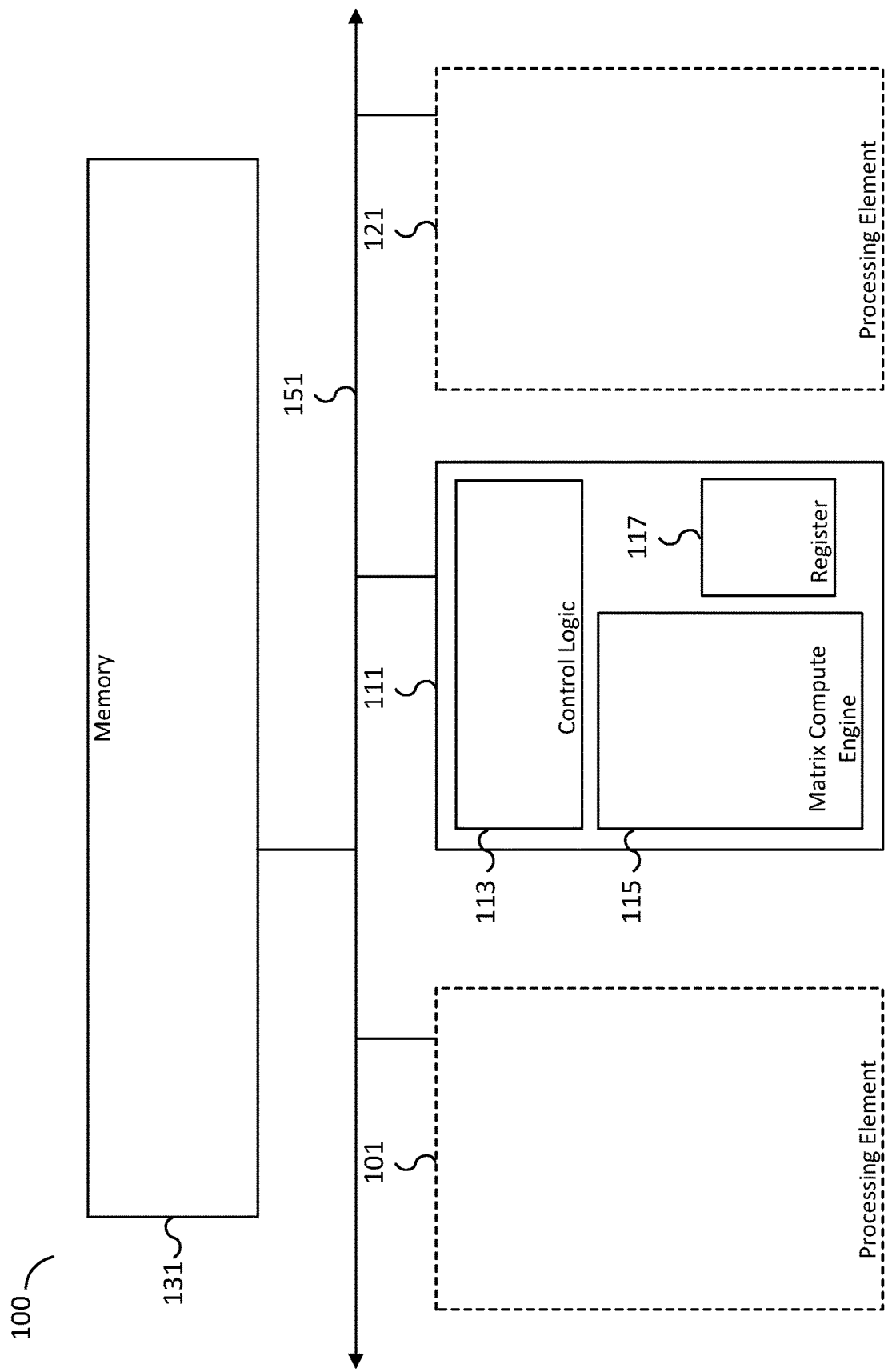
FIG. 1 is a block diagram illustrating an embodiment of a system for solving artificial intelligence problems using a neural network.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A device for improving the efficiency and performance of floating-point multiplication operations is disclosed. The disclosed device includes a multiplication unit configured to: receive a floating-point number in a first format representation, based on an identification of a floating-point format type of the floating-point number, identify different components of the first format representation, place the different components of the first format representation in corresponding components of a second format representation of the floating-point number, wherein a total number of bits of the second format representation is larger than a total number of bits of the first format representation, pad at least one of the components of the second format representation with one or more zero bits, and perform a multiplication using the second format representation of the floating-point number. The device also includes a register configured to store the floating-point number in the second format representation. In some embodiments, the multiplication unit is a processing element or part thereof (e.g., processing element 111 of FIG. 1). Practical and technological benefits of the disclosed device include improved efficiency and performance of multiplication operations, e.g., through more efficient use of integrated circuit chip area and reduced power consumption.

Neural network accelerators commonly need to calculate dot products between vectors of low-bit-width floating-point numbers in formats such as half precision binary floating-point format (also referred to herein as "fp16", "FP16", etc.) or Brain Floating Point floating-point format (also referred to herein as "bfloat16", "BFloat16", etc.). Fp16 numbers have 5 bits of exponent and 10 bits of mantissa, while bfloat16 numbers have 8 bits of exponent and 7 bits of mantissa. Each uses one sign bit. To maximize software flexibility, it is desirable to provide for a choice of several different floating-point types so that precision and dynamic range can be chosen to best suit application needs. However, this makes hardware more complex and expensive. For example, implementing a separate dot product engine for each floating-point type uses a lot of integrated circuit chip area and increases leakage power consumption. Power is saved by using a single device instead of separate devices for each type of floating-point number.

In various embodiments, the disclosed device is a single multipurpose logic/multiplication unit that can efficiently perform dot products in any of several different floating-point types. In some embodiments, the multipurpose logic/multiplication unit computes the dot product of either two fp16 vectors or two bfloat16 vectors. In various embodiments, the hardware handles the worst case (largest bit width) from the possible floating-point formats at each computational step, and data is routed through the hardware as required by the type of instruction received from software. For example, fp16 numbers have 5 bits of exponent and 10 bits of mantissa, while bfloat16 numbers have 8 bits of exponent and 7 bits of mantissa. To accommodate both formats in a single dot product engine, the hardware handles up to 8 bits of exponent and 10 bits of mantissa. If a software instruction is received for finding the dot product of two fp16 vectors, only 5 bits of exponent and the full 10 bits of mantissa are utilized. On the other hand, if a software instruction is received for finding the dot product of two bfloat16 vectors, the full 8 bits of exponent and only 7 bits of the mantissa are utilized.

In order to accommodate multiple floating-point formats with the same hardware, the bit width of the logic components is extended to the worst-case width. As described in further detail herein, in various embodiments, adders are used to add exponents and multipliers are used to multiply mantissas. For example, an fp16 dot product unit may require a 6-bit adder (adding two 5-bit exponents can result in a 6-bit result) and an 11-bit multiplier (10 mantissa bits plus one J-bit). A bfloat16 dot product unit may require a 9-bit adder (adding two 8-bit exponents can result in a 9-bit result) and an 8-bit multiplier (7 mantissa bits plus one J-bit). To combine the logic for these two formats, a single dot-product engine could include a 9-bit adder and an 11-bit multiplier in order to accommodate the worst-case widths of both formats. Using appropriate control logic (e.g., a plurality of multiplexers), the appropriate number of bits can be fed into the adder and multiplier. For example, to find the dot product of two bfloat16 vectors, the full 8-bit exponent of each bfloat16 element is used to fill the inputs to the 9-bit adders, but only 8 bits of the multiplier inputs are used (and the unused bits are padded with zeros.) Intermediate steps may be performed in the usual way (e.g., adders are used to add exponents and multipliers are used to multiply mantissas), and at the end, the final result may be rounded and normalized to conform to a desired output format.

The example above (and described in detail below) of a device that includes a multiplication unit that is configured to perform multiplication is merely an illustrative example. In various embodiments, the device is an arithmetic device that is configured to perform floating-point addition, subtraction, multiplication, and/or division in multiple formats. Stated alternatively, a device for improving the efficiency and performance of floating-point arithmetic operations is disclosed. This disclosed device includes an arithmetic unit configured to: receive a floating-point number in a first format representation, based on an identification of a floating-point format type of the floating-point number, identify different components of the first format representation, place the different components of the first format representation in corresponding components of a second format representation of the floating-point number, wherein a total number of bits of the second format representation is larger than a total number of bits of the first format representation, pad at least one of the components of the second format representation with one or more zero bits, and perform an arithmetic operation using the second format representation of the floating-point number. This device also includes a register configured to store the floating-point number in the second format representation. The techniques disclosed herein for multiplication are readily applicable (as is apparent to a person skilled in the art) to addition, subtraction, and division. For example, to perform addition or subtraction instead of multiplication, a floating-point adder (the adder being configured to perform addition and/or subtraction, with subtraction being the addition of negative numbers) can be used instead of a floating-point multiplication unit. Furthermore, as is apparent to one skilled in the art, to perform division instead of multiplication, a floating-point divider can be used to subtract exponents (instead of add) and divide mantissas (instead of multiply).

FIG. 1 is a block diagram illustrating an embodiment of a system for solving artificial intelligence problems using a neural network. For example, system 100 may be applied to use a neural network to solve problems such as image recognition and recommendation system matches. In the example shown, system 100 includes multiple processing elements such as processing elements 101, 111, and 121 connected to memory unit 131 via bus 151. System 100 may include fewer or more processing elements. For example, the number of processing elements can be scaled up or down depending on the intended computational and data requirements. In some embodiments, the processing elements, such as 101, 111, and 121, are communicatively connected to one another and/or memory unit 131 via bus 151. For example, the memory unit may be a last level cache (LLC) and/or may be implemented using static random-access memory (SRAM). Each processing element may be utilized by system 100 to perform matrix compute operations such as matrix multiplications including floating-point multiplications.

In some embodiments, a communication bus, such as bus 151, is used to transmit processing element instructions and optional instruction arguments. For example, a matrix operation and matrix operands may be transmitted to a processing element, such as processing elements 101, 111, and/or 121, via bus 151. Additional processing element instructions may include multiplication operation instructions such as floating-point multiplication operation instructions. In various embodiments, a large, complex artificial intelligence problem can be solved using system 100 by subdividing the problem into smaller sub-problems. The smaller sub-problems can be assigned and distributed to different processing elements. The results of the smaller sub-problems can be merged to determine the solution to the larger and more complex problem. In some scenarios, the sub-problems are solved in parallel and/or in pipelined stages. In some scenarios, the result from a first processing element is fed as an input to a second processing element.

In some embodiments, each processing element of system 100 includes at least a control logic unit and a matrix compute engine. As shown with respect to processing element 111, processing element 111 includes control logic 113 and matrix compute engine 115. Processing elements 101 and 121 are shown as dotted boxes and some details of processing elements 101 and 121 are not shown. In some embodiments, the control logic unit of a processing element is used to control the operation of the processing element, including the operation of the processing element's matrix compute engine. In the example shown, control logic 113 processes instructions directed to processing element 111 via communication bus 151. For example, a processing element instruction may include a floating-point multiplication instruction. In some embodiments, control logic 113 determines how to perform the floating-point multiplication using matrix compute engine 115, including how to determine components of floating-point number operands. In some embodiments, control logic 113 receives processing element instructions via bus 151 and can be used to initiate retrieving and/or writing data from/to memory 131.

In some embodiments, matrix compute engine 115 is a hardware matrix compute engine for performing matrix operations including operations related to floating-point multiplication, matrix multiplication, and/or convolution operations. For example, matrix compute engine 115 may be a matrix engine for performing dot product operations requiring floating-point multiplications and addition operations. In some embodiments, the convolution operations supported include depthwise, groupwise, normal, regular, pointwise, two-dimensional, and/or three-dimensional convolutions, among others. For example, matrix compute engine 115 may receive a first input matrix such as a subset of a large image and a second input matrix such as a filter, kernel, or convolution matrix, etc. to apply to the first input matrix. Matrix compute engine 115 can be used to perform a convolution operation using the two input matrices to determine a resulting output matrix. In some embodiments, matrix compute engine 115 includes input and/or output buffers for loading input data matrices or vectors and writing out a result data matrix or vector. In some embodiments, matrix compute engine 115 includes multiple vector units and each vector unit includes a vector multiply unit and a vector adder unit.

In some embodiments, control logic 113 includes a plurality of multiplexers that direct different components of floating-point inputs to matrix compute engine 115 based on the format of the floating-point inputs. For example, if an fp16 format is detected (e.g., based on processing element instructions via bus 151), multiplexers route the 5-exponent-bit components and 10-mantissa-bit components of the fp16 floating-point numbers to matrix compute engine 115. If a bfloat16 format is detected (e.g., based on processing element instructions via bus 151), multiplexers route the 8-exponent-bit components and 7-mantissa-bit components of the bfloat16 floating-point numbers to matrix compute engine 115. In various embodiments, routed components are first stored in registers (e.g., for intermediate storage) and then contents of the registers are routed to multiply units or vector multiply units of matrix compute engine 115.

In some embodiments, processing element 111 includes a plurality of registers that store floating-point inputs, floating-point inputs converted to an intermediate format, floating-point multiplication outputs, and/or other appropriate data. In some embodiments, a floating-point number input in a first format representation is converted to a second format representation that is stored in a register (e.g., register 117). In some embodiments, the second format representation is floating-point layout 521 of FIG. 5. In some embodiments, the register that stores the second format representation is padded with zeros due to the second format representation having more bits than the first format representation. An offset in the exponent field may be added or subtracted depending on the input type (e.g., for fp16 and bfloat16) in order to ensure that padding with zeros does not alter the exponent value that is stored. In various embodiments, control logic 113 directs the padding with zeros based on the format of the floating-point inputs. In some embodiments, this is performed using multiplexers within control logic 113. For example, if an fp16 format is detected (e.g., based on processing element instructions via bus 151), multiplexers can route zeros to unfilled exponent bit locations of floating-point layout 521 of FIG. 5 (because fp16 uses 5 exponent bits and floating-point layout 521 accommodates 8 exponent bits). If a bfloat16 format is detected (e.g., based on processing element instructions via bus 151), multiplexers can route zeros to unfilled mantissa bit locations of floating-point layout 521 of FIG. 5 (because bfloat16 uses 7 mantissa bits and floating-point layout 521 accommodates 11 bits (J-bit and 10 mantissa bits)).

Figure 2:
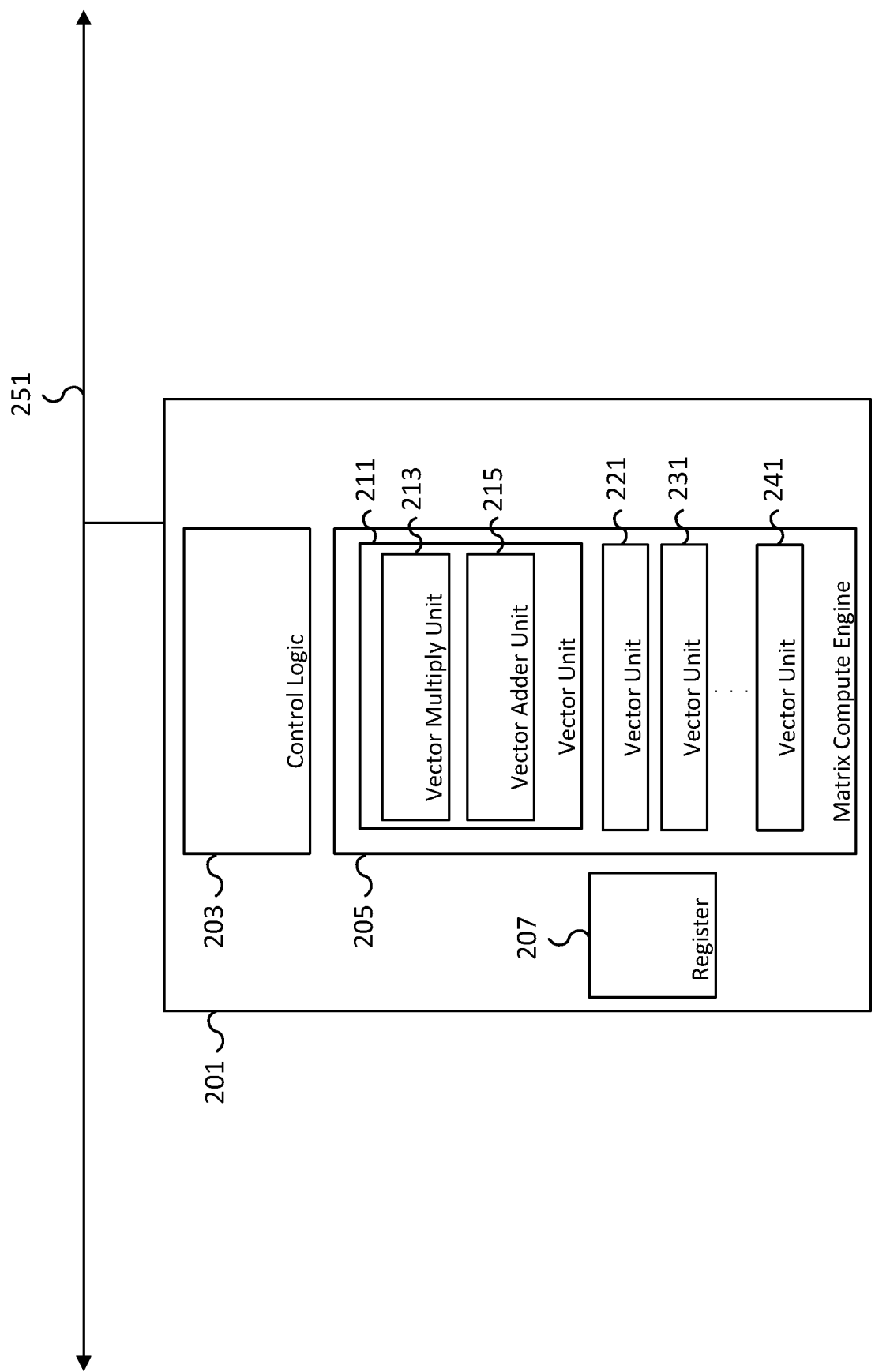
FIG. 2 is a block diagram illustrating an embodiment of a processing element for solving artificial intelligence problems using a neural network.

FIG. 2 is a block diagram illustrating an embodiment of a processing element for solving artificial intelligence problems using a neural network. In the example shown, processing element 201 is communicatively connected to bus 251. Processing element 201 includes control logic 203, matrix compute engine 205, and register 207. Matrix compute engine 205 includes vector units 211, 221, 231, and 241. Matrix compute engine 205 may include more or fewer vector units. For example, a matrix compute engine may include 32 vector units, each capable of processing two 32-element vectors. In various embodiments, each vector unit includes a vector multiply unit and a vector adder unit. In the example shown, vector unit 211 includes vector multiply unit 213 and vector adder unit 215. For simplicity, the vector multiply and vector adder units of vector units 221, 231, and 241 are not shown but function similarly to vector multiply unit 213 and vector adder unit 215. In some embodiments, processing element 201 is processing element 101, 111, and/or 121 of FIG. 1. In some embodiments, control logic 203 and matrix compute engine 205 are, respectively, control logic 113 and matrix compute engine 115 of FIG. 1.

In some embodiments, matrix compute engine 205 receives input matrix (or vector) operands to perform matrix operations. For example, matrix compute engine 205 may receive one or more data input vectors corresponding to a portion of an image and at least one weight input vector corresponding to a filter matrix. The input vectors, such as input data and weight vectors, may be passed as arguments to a vector unit, such as one of vector units 211, 221, 231, and 241, of matrix compute engine 205. For example, a vector unit of matrix compute engine 205 may determine a matrix result, such as a dot product result, using a data input vector and weight input vector pair. In some embodiments, matrix compute engine 205 includes 32 vector units. Each vector unit may take two 32-element vectors as arguments and each determine a 32-element vector result. In some embodiments, the result is a single element result and taken across all vector units of matrix compute engine 205. In some embodiments, the result is an output vector result. In various embodiments, output results are determined by accumulating partial vector results across multiple vector unit operations. For example, a multiplication operation can be decomposed into multiple multiplication operations and the results summed. The number of vector units of matrix compute engine 205 can vary as can the vector unit lengths and element sizes. For example, elements may be 4-bit, 8-bit, 2-byte, 4-byte, or another appropriate size. Depending on the capabilities of the vector unit, different element sizes can be natively supported.

In some embodiments, each vector unit of matrix compute engine 205, such as vector units 211, 221, 231, or 241, receives two vector operands and can perform one or more vector operations. For example, a vector unit can compute the result of multiple multiply operations by multiplying each element of the first input vector with a corresponding element of a second input vector. The resulting multiplication results can be accumulated and used for future operations, such as summing partial results. For example, a vector unit result can be accumulated and used as an operand to a subsequent operation performed by the vector unit.

Figure 6:
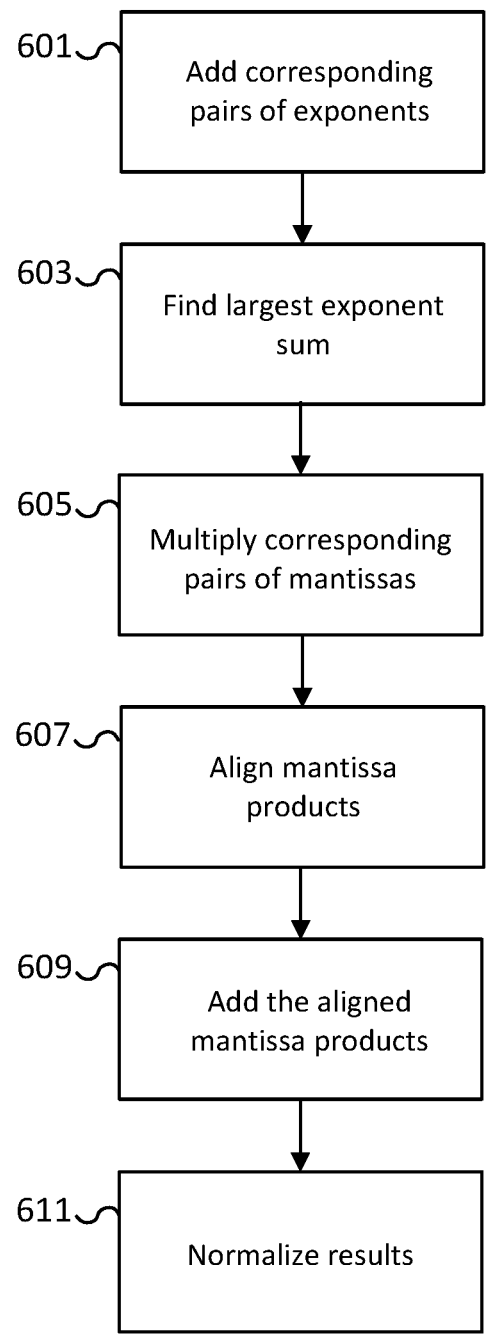
FIG. 6 is a flow chart illustrating an embodiment of a process for performing a floating-point dot product operation using a format representation compatible with multiple floating-point number formats.

In some embodiments, each vector unit of matrix compute engine 205, such as vector units 211, 221, 231, or 241, includes both a multiply unit and an adder unit. Each vector multiply unit of a vector unit, such as vector multiply unit 213, may be configured to multiply corresponding elements received via input vector operands. In various embodiments, vector multiply unit 213 includes a plurality of multipliers, wherein each multiplier is configured to perform a floating-point multiplication of pairs of elements as described in steps 601-607 of FIG. 6. As described in further detail below (e.g., see FIG. 6), in various embodiments, performing a floating-point multiplication includes adding corresponding pairs of exponents, finding a largest exponent sum, multiplying corresponding pairs of mantissas, and aligning mantissa products (based at least in part on the largest exponent sum). The example of FIG. 6 is a dot product process. In various embodiments, as described in further detail below (e.g., see FIG. 6), the aligned mantissa products are added as part of calculating a dot product result. For example, vector adder unit 215 may be used to add aligned mantissa products.

In various embodiments, a vector of multiplication results is passed to a vector adder unit of the vector unit. For example, vector multiply unit 213 can pass its multiplication results to vector adder unit 215. Vector adder unit 215 can be used for addition operations such as summing partial results, computing at least in part a dot product result, or other appropriate functionality.

In some embodiments, each vector adder unit of a vector unit, such as vector adder unit 215, is configured to compute addition operations using elements from an input vector. For example, the sum of selected elements from a vector of multiplication results computed by vector multiply unit 213 may be computed by vector adder unit 215. In some embodiments, the result of a vector adder unit is a dot product of the vectors used as inputs to the corresponding vector multiply unit. In various embodiments, each vector adder unit, such as vector adder unit 215, is implemented as an adder tree. For example, the top level of an adder tree may add pairs of elements to determine a set of partial sums, such as adding elements 0 and 1 to determine a first partial sum and elements 2 and 3 to determine a second partial sum, etc. Each subsequent level may sum pairs of partial sums from the previous level until the last level computes a final result sum. In some embodiments, specified partial sums may be outputted as a result of the adder unit. In various embodiments, each adder tree computes partial sums in parallel to arrive at a result sum. The parallel operation significantly improves the efficiency of summing a vector of numbers. In various embodiments, multiple vector units can operate in parallel to compute multiple results in parallel, significantly improving the throughput of matrix compute engine 205.

In some embodiments, vector multiply unit 213 includes multipliers and adders that are used to multiply floating-point numbers. In various embodiments, multiplying floating-point numbers includes adding exponents of the floating-point numbers and multiplying the mantissas of the floating-point numbers. The added exponents and multiplied mantissas can then be combined to obtain a floating-point multiplication result. FIG. 6 illustrates a process in which multiplication of floating-point numbers is accomplished by adding exponents and multiplying mantissas. For example, in various embodiments, for floating-point numbers in the format of floating-point layout 521 of FIG. 5, 9-bit adders are used to add 8-bit exponent components (because adding two 8-bit numbers can produce a 9-bit result) and 11-bit multipliers are used to multiply 10-bit mantissa components (a J-bit combined with the 10 mantissa bits is 11 bits to be multiplied).

Figure 3:
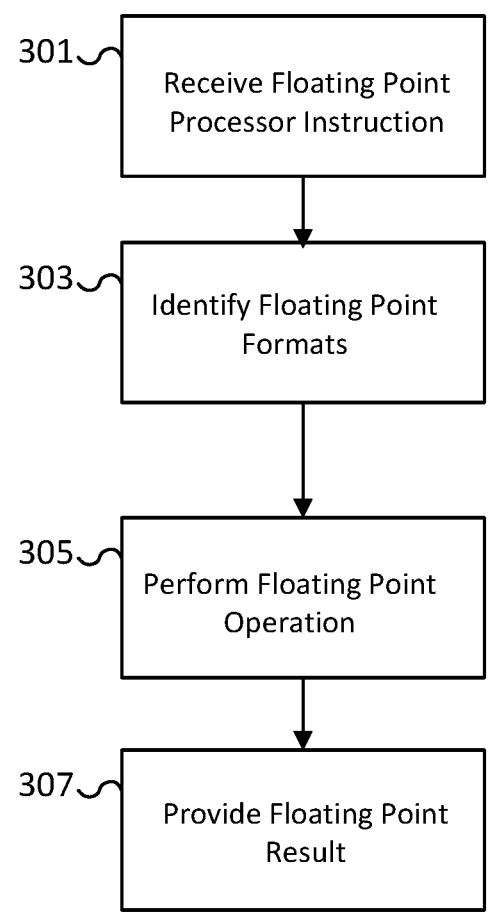
FIG. 3 is a flow chart illustrating an embodiment of a process for performing an operation associated with a matrix compute engine.

FIG. 3 is a flow chart illustrating an embodiment of a process for performing an operation associated with a matrix compute engine. For example, a dot product operation may be performed (e.g., see FIG. 6). In the process of FIG. 3, a compute operation using operands of various formats may be performed. In various embodiments, a hardware multiplier unit/processing element handles multiple floating-point number formats, e.g., fp16 and bfloat16. Using the disclosed techniques, a processing element is capable of supporting multiple floating-point formats and consequently multiple types of neural network models while maintaining a high throughput and with minimal additional hardware modifications. For example, an fp16 floating-point operation as well as a bfloat16 floating-point operation can be performed using a single matrix compute engine. In some embodiments, the process of FIG. 3 is performed in response to receiving an operation instruction at a control unit of a processing element, such as processing elements 101, 111, and/or 121 of FIG. 1 and/or processing element 201 of FIG. 2.

At 301, a floating-point processor instruction is received. The operation instruction may specify 16-bit floating-point numbers. For example, an fp16 floating-point dot product operation instruction specifying fp16 numbers can be received at a control logic component of a processing element. The operation instruction may also specify bfloat16 floating-point numbers. In some embodiments, the number of bits used by each operand may be 16-bits or another appropriate bit size.

At 303, the floating-point formats are identified. For example, the floating-point format for the specified operands are identified and may include fp16, bfloat16, and/or other floating-point formats. In various embodiments, multiple different floating-point formats are supported by the processing element. In some embodiments, the floating-point format is specified by the processor instruction. For example, a flag in the processor instruction can identify whether the floating-point format is fp16 versus bfloat16.

At 305, a floating-point operation is performed. For example, a dot product of two fp16 vectors or two bfloat16 vectors may be performed. In various embodiments, the floating-point operation is performed using a format representation compatible with multiple floating-point number formats.

At 307, the floating-point result is provided. For example, the floating-point result is provided to the next step for solving an artificial intelligence problem. In some embodiments, the result is utilized to solve the next layer of a neural network and/or combined with results from other processing elements. In some embodiments, the result is written back to memory such as memory 131 of FIG. 1 where the result can be utilized by a subsequent operation.

Figure 4:
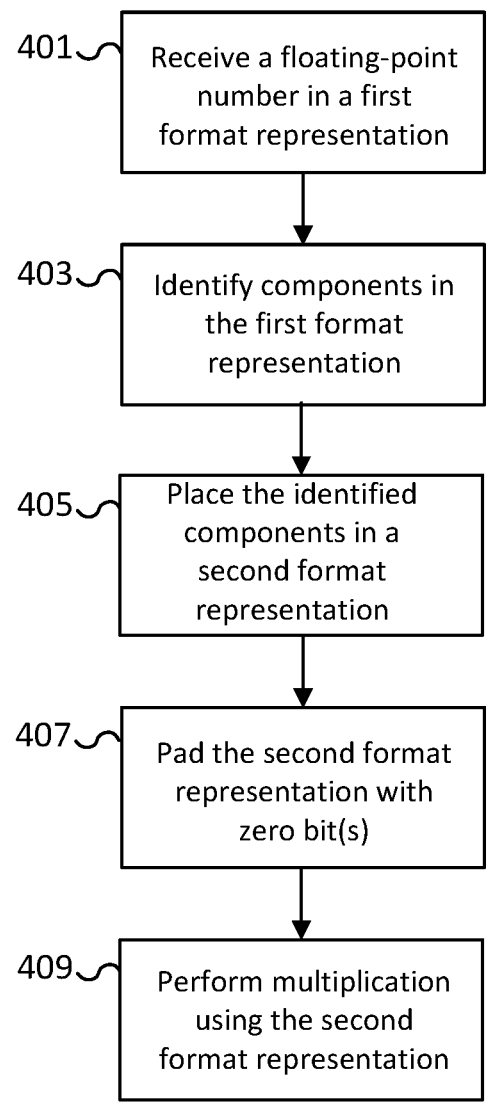
FIG. 4 is a flow chart illustrating an embodiment of a process for performing a floating-point multiplication using a format representation compatible with multiple floating-point number formats.

FIG. 4 is a flow chart illustrating an embodiment of a process for performing a floating-point multiplication using a format representation compatible with multiple floating-point number formats. In some embodiments, the process of FIG. 4 is performed in response to receiving a multiply operation instruction. For example, a processing element such as processing element 111 of FIG. 1 receives a multiply operation specifying operands using a floating-point format such as fp16 or bfloat16. In some embodiments, the process of FIG. 4 is performed using a control logic such as control logic 113 of FIG. 1 or control logic 203 of FIG. 2 and using a matrix compute engine such as matrix compute engine 115 of FIG. 1 or matrix compute engine 205 of FIG. 2. In some embodiments, at least a portion of the process of FIG. 4 is performed in 305 of FIG. 3.

At 401, a floating-point number is received in a first format representation. In some embodiments, the floating-point number is stored in a register, a scratch memory location, or another appropriate memory. In some embodiments, the floating-point number is stored into an input buffer for a matrix compute engine in preparation for performing a matrix operation. In some embodiments, the floating-point number is received from memory (e.g., memory 131 of FIG. 1) via a bus (e.g., bus 151 of FIG. 1 or bus 251 of FIG. 2). Examples of the first format representation include fp16, bfloat16, and any other floating-point number format. Fp16 and bfloat16 are 16-bit floating-point number formats. Floating-point number formats other than a 16-bit format are also possible.

Figure 5:
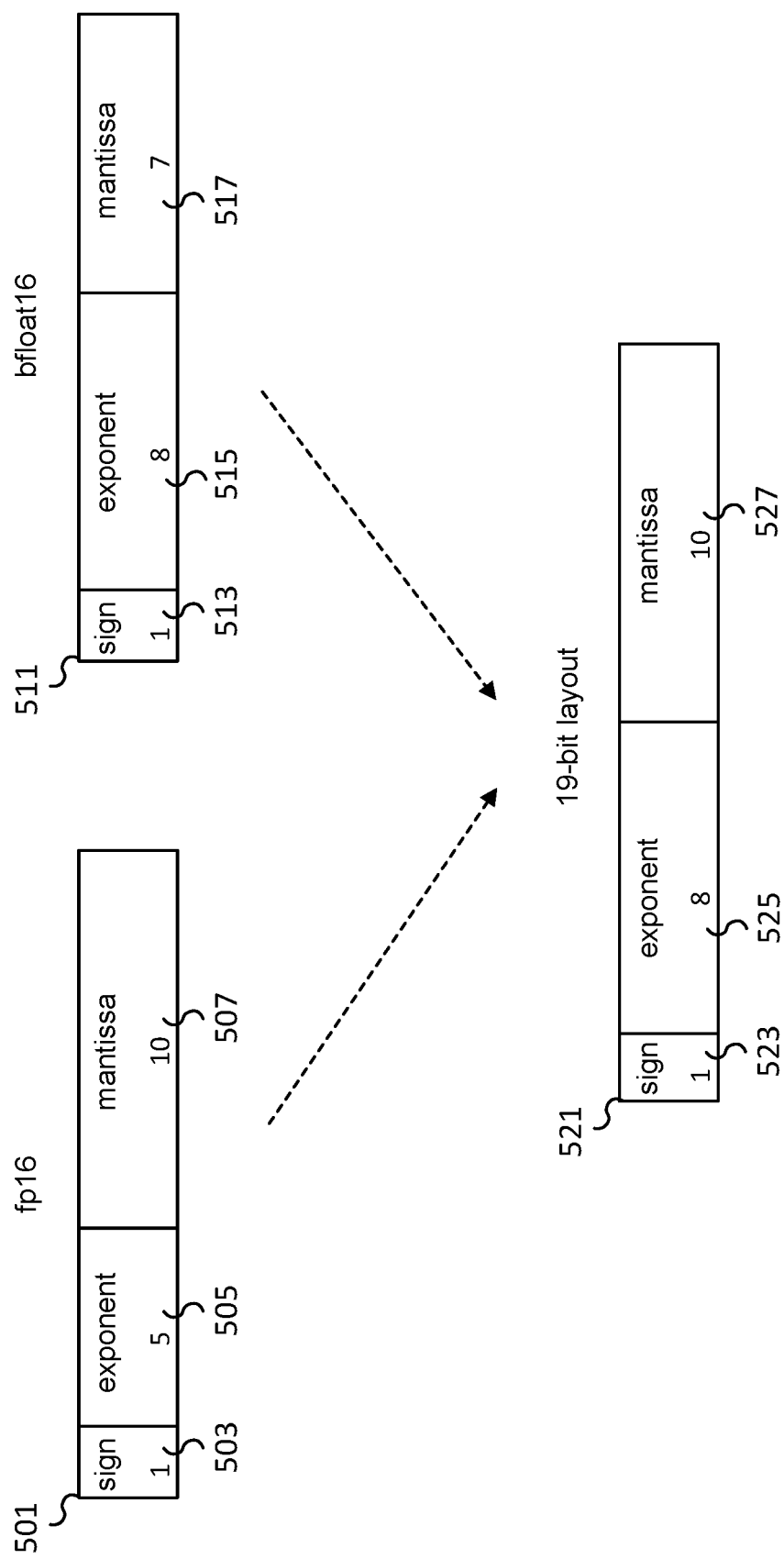
FIG. 5 is a diagram illustrating various floating-point number formats.

At 403, components in the first format representation are identified. For example, components of an fp16 format include a sign bit, 5 exponent bits, and 10 mantissa bits. The components of a bfloat16 format include a sign bit, 8 exponent bits, and 7 mantissa bits. In various embodiments, the identification is based on an identification of a floating-point format type of the floating-point number. For example, to determine which type of format a floating-point number is, a flag sent by software that is sending the multiply operation instruction can be read. In some embodiments, one or more software flags indicate the type of floating-point number format that is the first format representation (e.g., fp16, bfloat16, etc.). When the floating-point number format is identified, the locations of the components within the floating-point number are known. Floating-point layouts 501 and 511 of FIG. 5 show arrangements of the components of the fp16 format and bfloat16 format, respectively. Floating-point layout 501 is the fp16 format, including single sign bit component 503, 5 exponent bits component 505, and 10 mantissa bits component 507. Floating-point layout 511 is the bfloat16 format, including single sign bit component 513, 8 exponent bits component 515, and 7 mantissa bits component 517.

At 405, the identified components are placed in a second format representation. Stated alternatively, the different components of the first format representation are placed in corresponding components of a second format representation of the floating-point number. In various embodiments, the total number of bits of the second format representation is larger than the total number of bits of the first format representation. In various embodiments, a register is configured to store the floating-point number in the second format representation. A scratch memory location or another appropriate memory may also be used. In various embodiments, multiplexers direct logic (e.g., control logic 113 of FIG. 1 or control logic 203 of FIG. 2) based on the floating-point number format type.

In some embodiments, the second format representation is tailored to be able to store the full number of exponent bits of the bfloat16 format as well as the full number of mantissa bits of the fp16 format. In some embodiments, the second format representation includes a sign bit, 8 exponent bits, and 10 mantissa bits. Floating-point layout 521 of FIG. 5 shows an arrangement for a second format representation with a sign bit, 8 exponent bits, and 10 mantissa bits. Floating-point layout 521, including single sign bit component 523, 8 exponent bits component 525, and 10 mantissa bits component 527, has components with large enough bit widths to store the fp16 format of floating-point layout 501 as well as the bfloat16 format of floating-point layout 511. Components 503 (sign bit), 505 (exponent bits), and 507 (mantissa bits) of floating-point layout 501 can be transferred to and stored in components 523, 525, and 527, respectively, of floating-point layout 521. In addition, components 513 (sign bit), 515 (exponent bits), and 517 (mantissa bits) of floating-point layout 511 can also be transferred to and stored in components 523, 525, and 527, respectively, of floating-point layout 521.

At 407, the second format representation is padded with one or more zero bits. At least one of the components of the second format representation is padded with one or more zero bits. For example, when the first format representation is the fp16 format with the layout of floating-point layout 501 of FIG. 5 and the second format representation has the layout of floating-point layout 521 of FIG. 5, the second format representation includes three extra exponent bits that the first format representation does not include. In this scenario, the three leftmost (most significant bit) bits of component 525 of FIG. 5 can be padded with zeros and an offset added or subtracted in order to ensure that padding with zeros does not alter the exponent value that is stored. This is because the exponent is greater than or equal to one, meaning leading zero bits do not alter the exponent value. In the example shown in FIG. 5, sign bit component 503 and mantissa bits component 507 of floating-point layout 501 have the same bit widths as the corresponding components in floating-point layout 521; thus, those components of floating-point layout 521 would not be padded with zeros when the first format representation is the fp16 format with the layout of floating-point layout 501.

When the first format representation is the bfloat16 format with the layout of floating-point layout 511 of FIG. 5 and the second format representation has the layout of floating-point layout 521 of FIG. 5, the second format representation includes three extra mantissa bits that the first format representation does not include. In this scenario, the three rightmost bits of component 527 of FIG. 5 can be padded with zeros without altering the decimal value represented and stored. This is because the mantissa bits store values that decrease from leftmost mantissa bit to rightmost mantissa bit, meaning trailing zero bits do not alter the mantissa. In the example shown in FIG. 5, sign bit component 513 and exponent bits component 515 of floating-point layout 511 have the same bit widths as the corresponding components in floating-point layout 521; thus, those components of floating-point layout 521 would not be padded with zeros when the first format representation is the bfloat16 format with the layout of floating-point layout 511.

At 409, a multiplication is performed using the second format representation of the floating-point number. The multiplication may be in response to a multiply operation instruction specifying two numbers to be multiplied (e.g., two fp16 format or two bfloat16 format numbers). The multiplication may also be in response to a vector instruction. Stated alternatively, the multiplication may be a part of a set of multiplications. For example, two vectors of operands may be received and each element of a first vector may be multiplied with a corresponding element of a second vector. The multiplicative products may be summed to produce an output of a single number. Stated alternatively, the multiplication may be in response to a dot product instruction and part of multiple multiplications needed to perform a dot product operation (e.g., see FIG. 6).

In various embodiments, the multiplication is performed using a single type of compute unit (e.g., matrix compute engine 115 of FIG. 1 or matrix compute engine 205 of FIG. 2) regardless of the first format representation (e.g., fp16 or bfloat16). This is achievable because the second format representation can accommodate multiple first format representations (e.g., both fp16 and bfloat16). The second format representation can handle worst case (largest bit width) components across the multiple first format representations. Using a single type of compute unit for multiple first format representations has the benefit of reduced power consumption (e.g., compared with using multiple types of compute units tailored to the multiple first format representations). The output of the multiplication may be stored in an accumulator of the matrix compute engine or another appropriate memory location.

In some embodiments, the output of the multiplication is rounded. For example, the output may be rounded from the second format representation (e.g., with the layout of floating-point layout 521 of FIG. 5) to the first format representation (e.g., fp16, bfloat16, etc.). Stated alternatively, the output may be rounded to match the format of the input number type. In some embodiments, the output of the multiplication is placed into another format. For example, the different components of the output of the multiplication can be placed in corresponding components of a third format representation of the floating-point number, wherein a total number of bits of the third format representation is larger than a total number of bits of the second format representation. An example of the third format representation is the single-precision floating-point format (also referred to herein as "fp32"), which includes a sign bit, 8 exponent bits, and 23 mantissa bits. The extra bits in the mantissa of the fp32 format can be padded with zeros. In some embodiments, the majority of the mantissa bits of the fp32 format can be filled with decimal bits generated from the multiplication of second format representation values. For example, multiplying two numbers with 10-bit mantissas can generate a product with up to 22 mantissa bits (11 bits from each number due to 10 mantissa bits and the J-bit for each number), which can fit within the 23 mantissa bits of the fp32 format.

FIG. 5 is a diagram illustrating various floating-point number formats. The formats shown are discussed above with respect to the process of FIG. 4. In the example shown, a floating-point format represented by floating-point layout 501 includes three components: single sign bit component 503, 5 exponent bits component 505, and 10 mantissa bits component 507. Floating-point layout 501 is the 16-bit floating-point number format fp16. A floating-point format represented by floating-point layout 511 also includes three components: single sign bit component 513, 8 exponent bits component 515, and 7 mantissa bits component 517. Floating-point layout 511 is the 16-bit floating-point number format bfloat16. The components of floating-point layouts 501 and 511 can be placed into and stored in floating-point layout 521, which includes single sign bit component 523, 8 exponent bits component 525, and 10 mantissa bits component 527. Floating-point layout 521 includes 19 bits in order to accommodate the larger of the exponent components of floating-point layouts 501 and 511 (bit width of 8 in floating-point layout 511) as well as the larger of the mantissa components of floating-point layouts 501 and 511 (bit width of 10 in floating-point layout 501).

In various embodiments, a processing element such as processing element 111 of FIG. 1 receives a multiply operation instruction specifying operands using the format of either floating-point layout 501 or 511 (bit width of 16). Due to the larger bit width of floating-point layout 521, floating-point layout 521 can receive all of the exponent and mantissa bits of either floating-point layout 501 or floating-point layout 511 and thus support a multiply operation instruction specifying operands using the format of either floating-point layout 501 or 511. In some embodiments, the multiply operations are performed using the processes of FIGS. 3, 4, and/or 6 and the hardware shown in FIGS. 1 and/or 2. The example of FIG. 5 utilizes 16-bits for floating-point layouts 501 and 511 and 19-bits for floating-point layout 521 but other appropriate bit-sizes may be utilized as well where the number of bits used by the original floating-point number (first format representation) is less than the number of bits used by a secondary format (second format representation) into which the original floating-point number is to be placed.

FIG. 6 is a flow chart illustrating an embodiment of a process for performing a floating-point dot product operation using a format representation compatible with multiple floating-point number formats. In some embodiments, the process of FIG. 6 is performed in response to receiving a multiply operation instruction. For example, a processing element such as processing element 111 of FIG. 1 receives a multiply operation specifying vector operands using a floating-point format such as fp16 or bfloat16. In some embodiments, the process of FIG. 6 is performed using a control logic such as control logic 113 of FIG. 1 or control logic 203 of FIG. 2 and using a matrix compute engine such as matrix compute engine 115 of FIG. 1 or matrix compute engine 205 of FIG. 2. In some embodiments, at least a portion of the process of FIG. 6 is performed in 305 of FIG. 3. In some embodiments, at least a portion of the process of FIG. 6 is performed in 409 of FIG. 4.

Vector operands may be provided to a multiplication unit. For example, vector operands may be provided to a matrix compute engine such as matrix compute engine 115 of FIG. 1 or matrix compute engine 205 of FIG. 2. In some embodiments, a vector multiply unit such as vector multiply unit 213 of FIG. 2 receives a pair of vector operands. In some embodiments, multiple vector multiplication units each receive vector operands. For example, each multiplication vector unit can operate on a pair of vector operands in parallel. In some embodiments, a selected vector operand can be broadcasted to multiple vector units in the event multiple vector units share the same operand. For example, in some embodiments, the matrix compute engine supports a broadcast functionality to broadcast the same vector operand to multiple vector units.

At 601, corresponding pairs of exponents from two vectors of floating-point inputs are added. Stated alternatively, exponents for corresponding elements in a pair of vectors are added. For example, with two vectors A and B of length N each, N pairs of exponents are added. In some embodiments, a set of adder units adds the pairs of exponents. In some embodiments, a 9-bit adder is used to add exponents of fp16 and bfloat16 format numbers because the largest number of exponent bits for the two formats is 8 exponent bits for bfloat16 and the sum of two 8-bit numbers can be a 9-bit number. In some embodiments, the addition is performed within vector multiply unit 213 of FIG. 2.

At 603, the pairs of exponents that have been added are compared and a maximum is determined. Stated alternatively, the largest of the sums of corresponding exponents is determined. In various embodiments, floating point values with smaller exponents can be converted to equivalent values using this largest of the sums of corresponding exponents. For example, if the largest of the sums of corresponding exponents is 15, a floating-point number of $1.1 \times 2^{13}$ can be converted to $0.011 \times 2^{15}$ by shifting the mantissa. In some embodiments, depending on specific floating-point format representations used, the largest of the sums of corresponding exponents+1 is determined and subsequently used for alignment if it would otherwise be possible to generate a value with an exponent larger than the largest of the sums of corresponding exponents (e.g., due to adding two numbers with exponents equal to the largest of the sums of corresponding exponents). It is also possible to apply this +1 correction during a normalization stage (e.g., during step 611).

At 605, corresponding pairs of mantissas (of corresponding elements in the vectors of the dot product operation) are multiplied. In some embodiments, an 11-bit multiplier is used to multiply mantissas of fp16 and bfloat16 format numbers because the largest number of mantissa bits for the two formats is 10 mantissa bits for fp16, which also includes a J-bit (10 mantissa bits plus one J-bit equals 11 bits). In some embodiments, the multiplication is performed within vector multiply unit 213 of FIG. 2.

At 607, the mantissa products are aligned to the largest exponent (determined at 603). For example, if the largest exponent is 15, the mantissa products are shifted (zeros padded to the left of the mantissa products) so that the shifted mantissa products multiplied by $2^{15}$ equal the unshifted mantissa products. In various embodiments, the shifting is performed using binary bit shifters directed by control logic (e.g., by control logic 113 of FIG. 1 or control logic 203 of FIG. 2).

At 609, the aligned mantissa products are added. By aligning the mantissa products at 607, it is possible to directly add the aligned mantissas and obtain correct results because all the resulting sums are referenced to a same exponent portion, e.g., each multiplied by $2^{15}$ if the largest exponent is 15.

At 611, results are normalized (if needed). Results may need to be normalized to account for overflow and underflow. Normalization requires a shift of mantissa bits to ensure that the final output has the correct number of bits. An appropriate correction to the exponent would also be applied. In various embodiments, after two vectors of floating-point numbers are multiplied (resulting in a vector result), the vector results are summed to determine a final dot product result. The summing operations may be performed using a vector adder unit such as vector adder unit 215 of FIG. 2. In some embodiments, results are stored in an accumulator of the matrix compute engine or another appropriate memory location.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A device, comprising:
a multiplication unit configured to:
receive a floating-point number in a first format representation;
based on an identification of a floating-point format type of the floating-point number, identify different components of the first format representation;
place the different components of the first format representation in corresponding components of a second format representation of the floating-point number, wherein:
a total number of bits of the second format representation is larger than a total number of bits of the first format representation; and
a number of bits of a component of the second format representation is equal to a number of bits of a corresponding component of the first format representation;
pad at least one of the components of the second format representation with one or more zero bits; and
perform a multiplication using the second format representation of the floating-point number; and
a register configured to store the floating-point number in the second format representation prior to the multiplication.

2. The device of claim 1, wherein the first format representation comprises a sign bit, five exponent bits, and ten mantissa bits.

3. The device of claim 1, wherein the first format representation comprises a sign bit, eight exponent bits, and seven mantissa bits.

4. The device of claim 1, wherein the identification of the floating-point format type includes a flag that specifies the floating-point format type.

5. The device of claim 1, wherein the multiplication unit is further configured to receive a multiply operation instruction that specifies the floating-point format type.

6. The device of claim 1, wherein the different components of the first format representation include a sign bit component, an exponent bits component, and a mantissa bits component.

7. The device of claim 1, wherein the total number of bits of the first format representation is sixteen.

8. The device of claim 1, wherein the total number of bits of the second format representation is at least nineteen.

9. The device of claim 1, wherein the second format representation comprises a sign bit, eight exponent bits, and ten mantissa bits.

10. The device of claim 1, wherein the multiplication unit is configured to pad at least one of the components of the second format representation with one or more zero bits including by being configured to place one or more zeros in one or more exponent bit locations of the second format representation in response to a determination that the floating-point format type of the floating-point number is half precision binary floating-point format.

11. The device of claim 1, wherein the multiplication unit is configured to pad at least one of the components of the second format representation with one or more zero bits including by being configured to place one or more zeros in one or more mantissa bit locations of the second format representation in response to a determination that the floating-point format type of the floating-point number is Brain Floating Point format.

12. The device of claim 1, wherein the multiplication unit is configured to perform the multiplication using the second format representation of the floating-point number including by being configured to add an exponent component of the second format representation to an exponent component of a different floating-point number.

13. The device of claim 1, wherein the multiplication unit is configured to perform the multiplication using the second format representation of the floating-point number including by being configured to multiply a mantissa component of the second format representation with a mantissa component of a different floating-point number.

14. The device of claim 1, wherein the multiplication unit is further configured to provide an output of the multiplication.

15. The device of claim 14, wherein different components of the output of the multiplication are placed in corresponding components of a third format representation of an output floating-point number, wherein a total number of bits of the third format representation is larger than the total number of bits of the second format representation.

16. The device of claim 14, wherein the output of the multiplication includes a floating-point number in a single-precision floating-point format.

17. The device of claim 1, wherein the multiplication is a part of an artificial neural network operation.

18. The device of claim 1, wherein the multiplication is a part of a plurality of multiplications associated with a vector multiplication or a dot product operation.

19. A method, comprising:
- receiving a floating-point number in a first format representation;
- based on an identification of a floating-point format type of the floating-point number, identifying different components of the first format representation;
- placing the different components of the first format representation in corresponding components of a second format representation of the floating-point number, wherein:
  - a total number of bits of the second format representation is larger than a total number of bits of the first format representation; and
  - a number of bits of a component of the second format representation is equal to a number of bits of a corresponding component of the first format representation;
- padding at least one of the components of the second format representation with one or more zero bits;
- storing the floating-point number in the second format representation in a register; and
- performing a multiplication using the second format representation of the floating-point number.

20. A device, comprising:
an arithmetic unit configured to:
- receive a floating-point number in a first format representation;
- based on an identification of a floating-point format type of the floating-point number, identify different components of the first format representation;
- place the different components of the first format representation in corresponding components of a second format representation of the floating-point number, wherein:
  - a total number of bits of the second format representation is larger than a total number of bits of the first format representation; and
  - a number of bits of a component of the second format representation is equal to a number of bits of a corresponding component of the first format representation;
- pad at least one of the components of the second format representation with one or more zero bits; and
- perform an arithmetic operation using the second format representation of the floating-point number; and a register configured to store the floating-point number in the second format representation prior to the arithmetic operation.

* * * * *